US009035610B2

(12) United States Patent
Rutkowski et al.

(10) Patent No.: US 9,035,610 B2
(45) Date of Patent: May 19, 2015

(54) SYSTEM AND METHOD FOR CONTROLLING OUTPUT OF A BATTERY PACK

(75) Inventors: Brian D. Rutkowski, Ypsilanti, MI (US); Brian C. Moorhead, Willis, MI (US)

(73) Assignee: A123 Systems LLC, Livonia, MI (US)

( * ) Notice: Subject to any disclaimer, the term of this patent is extended or adjusted under 35 U.S.C. 154(b) by 621 days.

(21) Appl. No.: 13/376,572

(22) PCT Filed: Jun. 8, 2010

(86) PCT No.: PCT/US2010/037703
§ 371 (c)(1),
(2), (4) Date: Dec. 15, 2011

(87) PCT Pub. No.: WO2010/144396
PCT Pub. Date: Dec. 16, 2010

(65) Prior Publication Data
US 2012/0074904 A1    Mar. 29, 2012

Related U.S. Application Data

(60) Provisional application No. 61/185,763, filed on Jun. 10, 2009.

(51) Int. Cl.
| | |
|---|---|
| *H02J 7/00* | (2006.01) |
| *H01M 10/44* | (2006.01) |
| *H01M 10/48* | (2006.01) |
| *G01R 31/36* | (2006.01) |

(52) U.S. Cl.
CPC .......... *H01M 10/44* (2013.01); *G01R 31/3658* (2013.01); *H01M 10/48* (2013.01); *H02J 7/0031* (2013.01)

(58) Field of Classification Search
USPC ........................................................ 320/112
See application file for complete search history.

(56) References Cited

U.S. PATENT DOCUMENTS

| 5,872,453 | A  | * | 2/1999 | Shimoyama et al. | ......... 324/431 |
| 7,053,588 | B2 | * | 5/2006 | Nakanishi et al. | ............ 320/104 |
| 7,557,460 | B2 | * | 7/2009 | Yugou | .......................... 307/10.7 |
| 2004/0189248 | A1 | | 9/2004 | Boskovitch et al. | |
| 2010/0141219 | A1 | * | 6/2010 | Li | ................. 320/162 |

FOREIGN PATENT DOCUMENTS

| KR | 20030050125 A | 6/2003 |
| KR | 20080053552 A | 6/2008 |

OTHER PUBLICATIONS

ISA Korean Intellectual Property Office, International Search Report of PCT/US2010/037703, Feb. 8, 2011, 3 pages.

\* cited by examiner

*Primary Examiner* — Drew A Dunn
*Assistant Examiner* — Robert Grant
(74) *Attorney, Agent, or Firm* — Alleman Hall McCoy Russell & Tuttle LLP

(57) ABSTRACT

Systems and methods for controlling the output of a battery pack are disclosed. In one example, a battery pack contactor is opened in response to battery pack current. The system and method may reduce battery pack degradation and increase system flexibility.

12 Claims, 4 Drawing Sheets

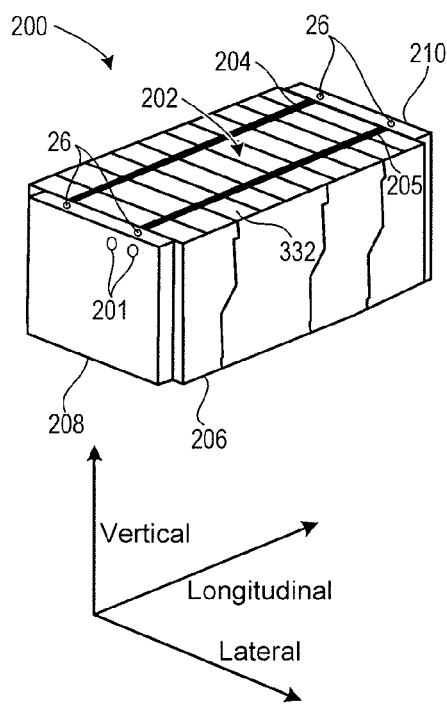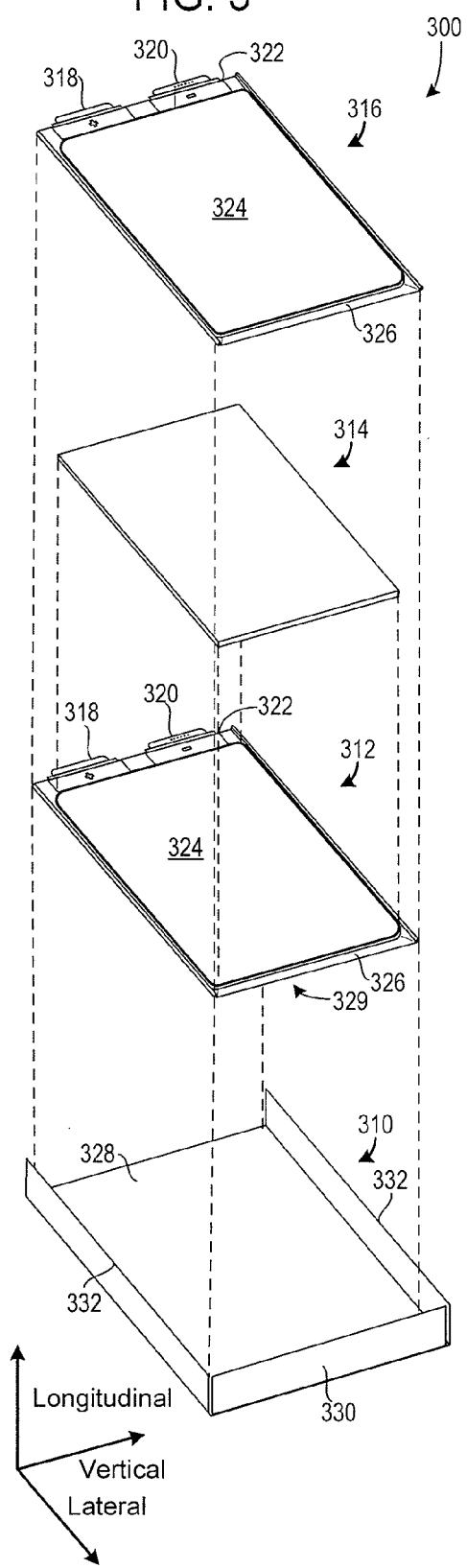

SYSTEM AND METHOD FOR CONTROLLING OUTPUT OF A BATTERY PACK

CROSS REFERENCE TO RELATED APPLICATIONS

This application is a U.S. National Phase of International (PCT) Application Serial No. PCT/US2010/037703, filed Jun. 8, 2010 and entitled SYSTEM AND METHOD FOR CONTROLLING OUTPUT OF A BATTERY PACK, which claims priority from U.S. Provisional Patent Application Ser. No. 61/185,763, filed Jun. 10, 2009 and entitled ROBUST LIMIT BATTERY FUSE, the entirety of both of which are hereby incorporated herein by reference for all intents and purposes.

TECHNICAL FIELD

The present description relates to controlling output of a battery pack. In one example, the battery pack provides power to a vehicle.

BACKGROUND AND SUMMARY

A battery pack may source or sink current during operation, where the amount of current may be limited due to various constraints. In order to stay within the battery pack limits, the battery pack may transmit the battery pack sourcing and/or sinking capacities to an external controller so that the external load or source that is in communication with the battery pack may adjust operation of the load or source to accommodate the battery pack limits. In addition, the battery pack current sinking and/or sourcing limits may be imposed via hardware. For example, fuses may be placed between battery cells and an external load or source to limit current flow into and out of the battery pack. Thus, degradation of a battery pack may be limited by way of a combination of hardware and software. However, accessing the battery pack to replace a blown fuse can be cumbersome. Furthermore, a load or source external to the battery pack may not have the capacity to precisely follow battery limits as desired during periods of degradation, or during transient operation. Further still, the degree to which the current limits are imposed may depend on the operating conditions, including the duration over which the over-current conditions persists and the degree to which the current is over the prescribed limit.

The inventor herein has recognized the above issues and developed various approaches to address them. In one approach, a method for controlling output of a battery pack, comprising: opening a contactor that electrically couples said battery pack to an electrical circuit external of said battery pack when an integrated variable or parameter related to a tracked variable of the battery pack exceeds a threshold amount, the integrated variable or parameter integrated when the tracked variable of said battery pack is greater than a threshold amount.

By opening a contactor that electrically couples a battery pack to a circuit that is external to the battery pack when an integrated amount of current of the battery pack exceeds a threshold level, it is possible to reduce the possibility of battery pack degradation without having to access the battery pack and replace a fuse. In particular, a contactor can be controlled in response to an output of a current sensor. For example, during periods when a battery is operating within prescribed limits the contactor can be controlled in response to requests to operate a vehicle. However, if the current entering or exiting the battery exceeds a threshold amount of current, the amount of current exceeding the threshold may be integrated. When the value of the integrated current exceeds a threshold the contactor may be opened. In this way, current flow into and out of a battery pack may be controlled without having to rely on a hardware fuse or an external controller. Further, the approach correlates the degree of over-current operation to the duration of that condition, in that current may be allowed to go slightly over limit for a long duration before opening the contactors, whereas current may be allowed to go significantly over limit for only a short duration before opening the contactors. In this way, it is possible to take advantage of the interrelationship between the degree and duration of over-current operation. Such an approach can reduce unnecessary contactor opening and thereby reduce intervening in drive operation. As some applications may be more prone to longer, but lower, over current conditions, while other applications may be more prone to shorter, but higher, over current conditions, the above approach accommodates both conditions and various combinations therebetween.

The present description may provide several advantages. In particular, the method can reduce battery pack degradation without having to replace hardware or rely on external systems. Further, the present description provides for additional measures of battery pack degradation protection. Further still, the level of threshold currents can be adjusted for different capacity battery packs without having to change hardware or software. Further still, the level of threshold currents may be changed dynamically with battery temperature, charge level, or age.

The above advantages and other advantages, and features of the present description will be readily apparent from the following Detailed Description when taken alone or in connection with the accompanying drawings.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

FIG. 2 shows a schematic view of an exemplary battery module;

FIG. 3 shows an exploded schematic view of an exemplary battery cell stack;

DETAILED DESCRIPTION OF THE DEPICTED EMBODIMENTS

Figure 1:
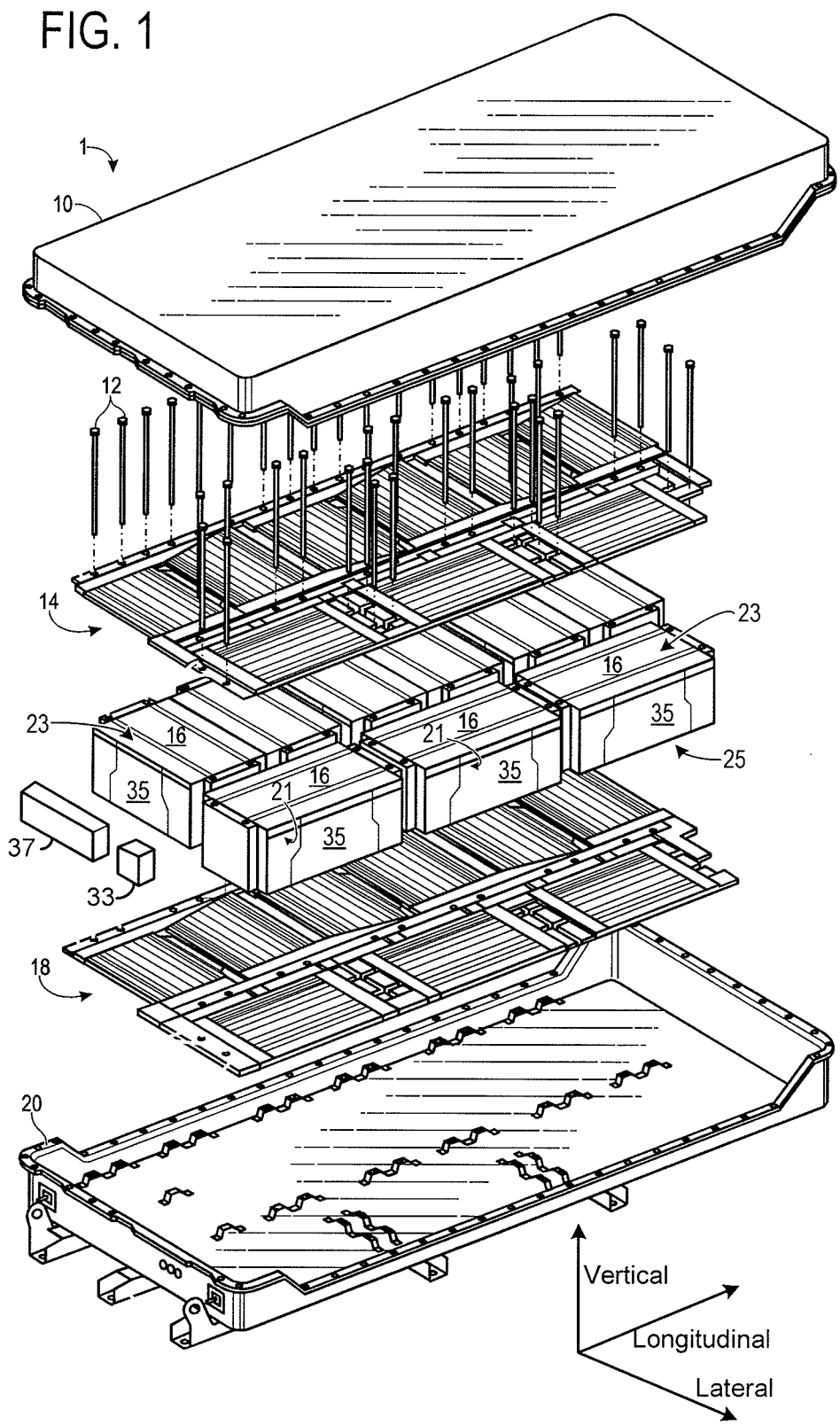
FIG. 1 shows an exploded schematic view of a battery pack or assembly.
Figure 4:
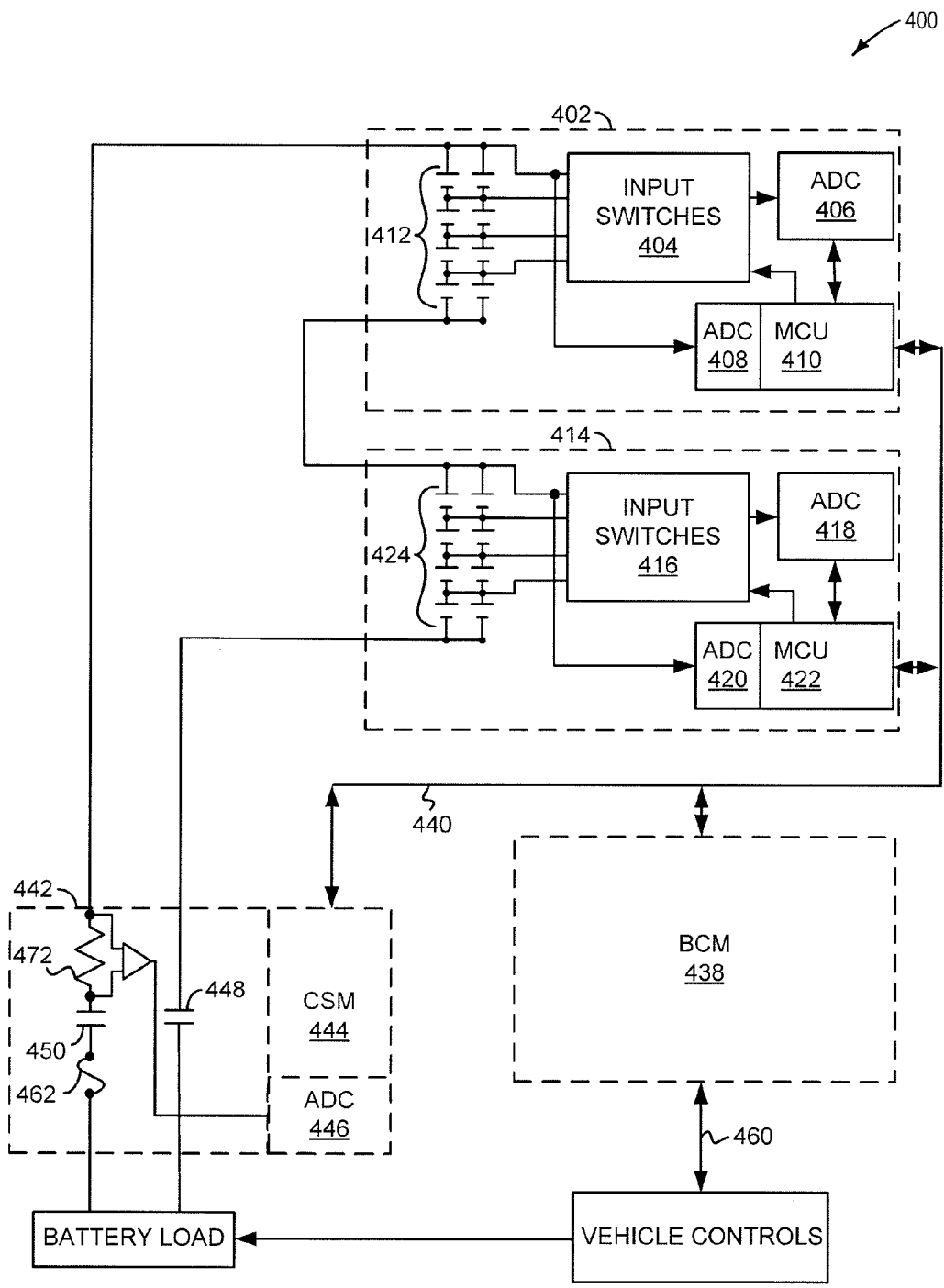
FIG. 4 shows an electrical schematic diagram for controlling battery pack output.

The present description is related to controlling the output of a battery pack. In one embodiment, battery cells such as those illustrated in FIGS. 2-3 may be combined in a battery pack as illustrated in FIG. 1. The power from the battery cells of FIGS. 1-3 may be selectively delivered to a load external to the battery pack via a contactor as shown in FIG. 4. In one example illustrated by the method of FIG. 5, a battery pack output of the system of FIG. 4 is decoupled from a load or source when current entering or exiting the battery pack exceeds a threshold level or amount.

FIG. 1 shows an exploded view of a battery assembly 1. The battery assembly may include a cover 10, coupling devices 12, a first cooling subsystem 14 (e.g., cold plate), a plurality of battery modules 16, a second cooling subsystem 18 (e.g., cold plate), and a tray 20. The cover may be attached to the tray via a suitable coupling device (e.g., bolts, adhesive, etc.,) to form a housing surrounding the coupling devices, the cooling subsystems, and the battery modules, when assembled.

The battery modules 16 may include a plurality of battery cells configured to store energy. Although a plurality of battery modules are illustrated, it will be appreciated that in other examples a single battery module may be utilized. Battery modules 16 may be interposed between the first cooling subsystem 14 and the second cooling subsystem 18, where the battery modules are positioned with their electrical terminals on a side 21 facing out between the cooling subsystems.

Each battery module may include a first side 23 and a second side 25. The first and the second side may be referred to as the top and bottom side, respectively. The top and bottom sides may flank the electrical terminals, discussed in greater detail herein with regard to FIGS. 2-3. In this example, the top side of each battery module is positioned in a common plane in the battery assembly. Likewise, the bottom side of each battery module is positioned in another common plane in the battery assembly. However, in other examples only the top side or the bottom side of each battery module may be positioned in a common plane. In this way, the cooling subsystems may maintain direct contact with the top sides and the bottom sides of the battery modules to increase heat transfer and improve cooling capacity, as described in further detail herein, wherein the cooling subsystems and the battery modules may be in face-sharing contact. Additional details of an exemplary battery module are described herein with regard to FIGS. 2-3. In alternate examples, only one of the cooling subsystems may be included in battery assembly 1, such as an upper cooling subsystem (subsystem 14 in this example). Moreover, the position, size, and geometry of the first and second cooling subsystems are exemplary in nature. Thus, the position, size, and/or geometry of the first and/or second cooling subsystems may be altered in other examples based on various design parameters of the battery assembly.

Battery assembly 1 may also include an electrical distribution module 33 (EDM), monitor and balance boards 35 (MBB), and a battery control module 37 (BCM). Voltage of battery cells in battery modules 16 may be monitored and balanced by MBBs that are integrated onto battery modules 16. Balancing battery cells refers to equalizing voltages between a plurality of battery cells in a battery cell stack. Further, battery cell voltages between battery cell stacks can be equalized. MBBs may include a plurality of current, voltage, and other sensors. The EDM controls the distribution of power from the battery pack to the battery load. In particular, the EDM contains contactors for coupling high voltage battery power to an external battery load such as an inverter. The BCM provides supervisory control over battery pack systems. For example, the BCM may control ancillary modules within the battery pack such as the EDM and cell MBB. Further, the BCM may be comprised of a microprocessor having random access memory, read only memory, input ports, real time clock, output ports, and a controller area network (CAN) port for communicating to systems outside of the battery pack as well as to MBBs and other battery pack modules.

FIG. 2 shows an exemplary battery module 200 that may be included in the plurality of battery modules 16, shown in FIG. 1. Battery module 200 may include a battery cell stack having a plurality of stacked battery cells and output terminals 201. The stacked arrangement allows the battery cells to be densely packed in the battery module.

FIG. 3 shows an exploded view of a portion of an exemplary battery cell stack 300. As shown the battery cell stack is built in the order of a housing heat sink 310, battery cell 312, compliant pad 314, battery cell 316, and so on. However, it will be appreciated that other arrangement are possible. For example, the battery cell stack may be built in the order of a housing heat sink, battery cell, housing heat sink, etc. Further in some examples, the housing heat sink may be integrated into the battery cells.

Battery cell 312 includes cathode 318 and anode 320 for connecting to a bus bar (not shown). The bus bar routes charge from one batter cell to another. A battery module may be configured with battery cells that are coupled in series and/or parallel. Bus bars couple like battery cell terminals when the battery cells are combined in parallel. For example, the positive terminal of a first battery cell is coupled to the positive terminal of a second battery cell to combine the battery cells in parallel. Bus bars also couple positive and negative terminal of battery cell terminals when it is desirable to increase the voltage of a battery module. Battery cell 312 further includes prismatic cell 324 that contains electrolytic compounds. Prismatic cell 324 is in thermal communication with cell heat sink 326. Cell heat sink 326 may be formed of a metal plate with the edges bent up 90 degrees on one or more sides to form a flanged edge. In the example of FIG. 3, two opposing sides include a flanged edge. However, other geometries are possible. Battery cell 312 is substantially identical to battery cell 316. Therefore similar parts are labeled accordingly. Battery cells 312 and 316 are arranged with their terminals in alignment and exposed. In battery module 200 shown in FIG. 2 the electric terminals are coupled to enable energy to be extracted from each cell in the battery module. Returning to FIG. 3, compliant pad 314 is interposed between battery cell 312 and battery cell 316. However, in other examples the compliant pad may not be included in the battery cell stack.

Housing heat sink 310 may be formed by a metal plate having a base 328 with the edges bent up 90 degrees on one or more sides to form a flanged edge. In FIG. 3 longitudinally aligned edge 330 and vertically aligned edges 332 are bent flanged edges. As depicted, the housing heat sink is sized to receive one or more battery cells. In other words, one or more battery cells may be positioned within base 328. Thus, the flanged edges of the battery cells may be in contact with housing heat sink and underside 329 of battery cell 312 may be in contact with the base of the housing heat sink, facilitating heat transfer.

One of the longitudinally aligned edges 332 of the housing heat sink 310 may form a portion of the top side 202 of battery module 200, as shown in FIG. 2. Similarly, one of the longitudinally aligned edges 332 may form a portion of the bottom side of the battery module. Thus, the longitudinally aligned edges of the housing heat sink may be in contact with the first and the second cooling subsystems to improve heat transfer. In this way, heat may be transferred from the battery cells to the exterior of the battery module.

The battery cells may be strapped together by binding bands 204 and 205. The binding bands may be wrapped around the battery cell stack or may simply extend from the front of the battery cell stack to the back of the battery cell stack. In the latter example, the binding bands may be coupled to a battery cover. In other embodiments, the binding bands may be comprised of threaded studs (e.g., metal threaded studs) that are bolted at the ends. Further, various other approaches may be used to bind the cells together into the stack. For example, threaded rods connected to end plates may be used to provide the desired compression. In another example, the cells may be stacked in a rigid frame with a plate on one end that could slide back and forth against the cells to provide the desired compressive force. In yet other embodiments, rods held in place by cotter pins may be used to secure the battery cells in place. Thus, it should be understood that various binding mechanisms may be used to hold the cell stack together, and the application is not limited to metal or plastic bands. Cover 206 provides protection for battery bus bars (not shown) that route charge from the plurality of battery cells to output terminals of the battery module.

The battery module may also include a front end cover 208 and a rear end cover 210 coupled to the battery cell stack. The front and rear end covers include module openings 26. However, in other examples the module openings may be included in a portion of the battery module containing battery cells.

Various methods are available to determine battery state of charge. By knowing the state of charge of a battery cell it is possible to determine whether or not the battery cell may accept additional charge. Further, by knowing the state of charge of a battery cell it is possible to determine when it is undesirable to further discharge a battery cell. One method of determining battery state of charge includes determining battery cell voltage.

Referring now to FIG. 4, a schematic diagram for controlling battery pack output is shown. In this example, battery pack 400 includes two battery cell stacks 402 and 414 as indicated by the dashed lines. Battery cells 412 and 424 are shown identically configured and are connected in series. However, battery cell stacks may be configured with different numbers of battery cells, and the battery cells may be configured differently if desired. For example, battery cells 412 and 424 are comprised of eight battery cells each. Four of the battery cells are arranged in series. Further, the four battery cells are arranged in parallel with four other battery cells that are arranged in series. In this configuration, each battery cell stack 402 and 414 outputs a voltage that is related to the number of battery cells connected in series as well as the individual voltage output of each battery cell. And, as discussed above, the current capacity or amp-hour rating of the battery cell stack may be related to the number of battery cells connected in parallel. As the number of battery cells arranged in parallel increases, the battery cell stack amp-hour rating increases. As the number of battery cells arranged in series increases, the output voltage of the battery cell stack increases. Thus, the voltage output of a battery pack can be increased or decreased by changing the number of battery cells arranged in a series connection. Likewise, the battery pack amp-hour rating may be increased or decreased by changing the number of battery cells arranged in parallel. Therefore, in this example, the battery pack voltage may be increased by adding additional battery cells in series with the battery cells of battery cell stacks 402 and 414. Alternatively, the battery cell stack amp-hour rating may be increased by adding more battery cells in parallel to battery cells 412 and 524.

Battery cell stacks 402 and 414 include input switches 404 and 416 for selectively coupling ADCs 406 and 418 to battery cells 412 and 424 respectively. MCUs 410 and 422 control the state of switches 404 and 416 by way of digital outputs from the respective MCUs. Input switches 404 and 416 are configured such that ADCs 406 and 418 may be coupled to individual battery cells to measure battery cell voltage without being influenced by the voltage of battery cells that may be placed in series with the battery cell being measured. In one embodiment, each MCU 410 and 422 may couple each series connected battery cell to respective ADCs 406 and 418. When battery cells are coupled in parallel, input switches 404 and 416 couple ADCs 406 and 418 to the battery cells of a cell stack that are coupled in parallel. Thus, each ADC coupled to a battery cell stack may be configured to measure the voltage of one or more battery cells coupled in parallel within the respective battery cell stack.

ADCs 406 and 418 are configured as high resolution (e.g., 12 or 16 bit resolution ADCs) devices that are external or off chip from MCUs 410 and 418 although ADCs may be on chip in other embodiments and may have different resolutions (e.g., 8 bit resolution). In one example, ADCs 406 and 418 communicate with MCUs 410 and 422 respectively by way of SPI ports. The SPI ports are used to transfer battery cell voltages to each MCU as the individual MCUs command input switches 404 and 416 to cycle through battery cells 412 and 424 respectively. By cycling through the switches, individual series battery cells are coupled to ADCs 406 and 418 for determining battery cell voltages.

ADCs 408 and 420 are lower resolution (e.g., 8 bit resolution) devices that are integrated to MCUs 410 and 422. In alternate embodiments, ADCs 408 and 420 may be of higher resolution (e.g., 12 or 16 bit resolution) and external from MCUs 410 and 422. ADCs 408 and 420 are configured to measure the series voltage provided by battery cells 412 and 424 for the respective battery cell stacks 402 and 414. For example, ADC 408 is configured to measure the voltage provided by the series combination of four battery cells coupled in parallel to four other battery cells, the battery cells indicated at 412. Thus, the ADC of an MBB is configured to measure the series combination of battery cells of a battery cell stack. Of course, an ADC of a MBB coupled to a battery cell stack may be configured to measure the voltage of additional or fewer battery cells than the four battery cells shown in FIG. 4. Further, as discussed above, the series combination of battery cells 412 acts to increase the output voltage of the battery cell stack 402.

MCUs 410 and 422 control input switches 404 and 416 as well as ADCs 406 and 408, 418, and 420. Further, MCUs 410 and 422 may store the respective battery voltages to memory and perform arithmetic and logical operations on battery voltage data captured by ADCs 406, 408, 418, and 420.

BCM 438 communicates with MCUs 410 and 422 of battery cell stacks 402 and 414 by way of CAN bus 440; however, other types of communication links are possible and anticipated. BCM 438 may acquire battery voltages and status indicators (e.g., flags that indicate degradation of an ADC, battery cell, or MCU) from battery cell stacks 402 and 414. BCM 438 also communicates with EDM 442 via hardwired digital inputs and outputs for opening and closing contactors 450 and 448. In an alternative embodiment, BCM 438 may communicate to EDM 442 via CAN 440 for sending instructions to close contactors 450 and 448 when it is determined to couple battery cell stacks 402 and 414 to the battery load or source. Contactors 450 and 448 act as electrically controlled switches and do not interrupt short circuit current without instruction from BCM 438. In one example, contactors 450 and 448 are normally open and include a closing coil and metallic contacts that may be engaged and disengaged with metallic current carrying conductors by operating the closing coil. In one example, the contactors open by physically moving apart. In applications where battery output requirements are lower, the battery output contactors may be silicon based contactors, FETs or IGBTs for example.

CSM 444 includes an ADC 446 for measuring battery pack current on the battery side of contactors 450 and 448. Current shunt 472 provides a voltage that is proportional to current flow entering or exiting the battery pack to a microcontroller within CSM 444. Alternatively, current may be sensed by a Hall device or other type of current sensor (e.g., a coil). The CSM microcontroller converts battery pack current into digital data via ADC 446. The microcontroller transmits current data to BCM 438 via CAN bus 440. In another example, current sensor data from battery cell stacks may be communicated to BCM 438 so that BCM can determine battery pack current. BCM 438 also communicates with a vehicle controller via CAN bus 460. Fuse 462 provides current limiting protection to the battery pack.

Thus, the system of FIG. 4 provides for a system for controlling output of a battery pack, comprising: a plurality of battery cells; a current sensor in electrical communication with said plurality of battery cells; a contactor in electrical communication with said plurality of battery cells and a load external said battery pack; and a controller, said controller in communication with said current sensor and said contactor, said controller including instructions for opening said contactor when an integrated current of said battery pack exceeds a threshold current. The controller may be the battery pack controller, and the system may further comprise a CAN link within said battery pack, said CAN link providing current data from said current sensor to said controller. The system can further comprise a CAN link between said controller and a vehicle controller. The system may also include a plurality of battery modules comprised of said plurality of battery cells, wherein said controller includes further instructions for integrating data from said current sensor when a current of said battery pack is greater than a threshold current, and instructions for closing said contactor after a predetermined sequence. The current sensor may be a shunt device.

The system of FIG. 4 also provides for a system for controlling output of a battery pack, comprising: a plurality of battery cells; a current sensor in electrical communication with said plurality of battery cells; a contactor in electrical communication with said plurality of battery cells and a load external said battery pack; and a controller, said controller in communication with said current sensor and said contactor, said controller including instructions for opening said contactor when an integrated variable or parameter related to a tracked variable of said battery pack exceeds a threshold amount, and wherein said tracked variable is a current from said current sensor.

The system of FIG. 4 also shows a system for controlling output of a battery pack, comprising: a plurality of battery cells; a CAN link; a contactor; a current sensor in electrical communication with said plurality of battery cells; a first module including a first controller, said first controller including instructions for relaying battery pack current data in a digital format to a second module via said CAN link; and a second module including a second controller, said second controller including instructions for receiving said battery pack current data in said digital format via said CAN link, said second controller including further instructions for opening said contactor when an integrated current of said battery pack exceeds a threshold current. Again, the second module may be the battery control module, and said battery control module may be electrically coupled to a plurality of monitor and balancing modules via said CAN link. The contactor may be a normally open contactor and include a closing coil and metallic contacts, said first module being the current sense module. The plurality of monitor and balance modules may each include a controller and battery cell voltage monitoring circuitry. The plurality of battery cells may be lithium-ion battery cells, and the controller may further include instructions for closing said contactor after predetermined conditions of a sequence are met.

The system of FIG. 4 also provides for a system for controlling output of a battery pack, comprising: a plurality of battery cells; a communication link; a contactor; a current sensor in electrical communication with said plurality of battery cells; a first module including a first controller, said first controller including instructions for relaying battery pack current data in a digital format to a second module via said communication link; and a second module including a second controller, said second controller including instructions for receiving said battery pack current data in said digital format via said communication link, said second controller including further instructions for opening said contactor when an integrated variable or parameter related to a tracked variable of said battery pack exceeds a threshold amount, and wherein said tracked variable is a current from said current sensor.

Figure 5:
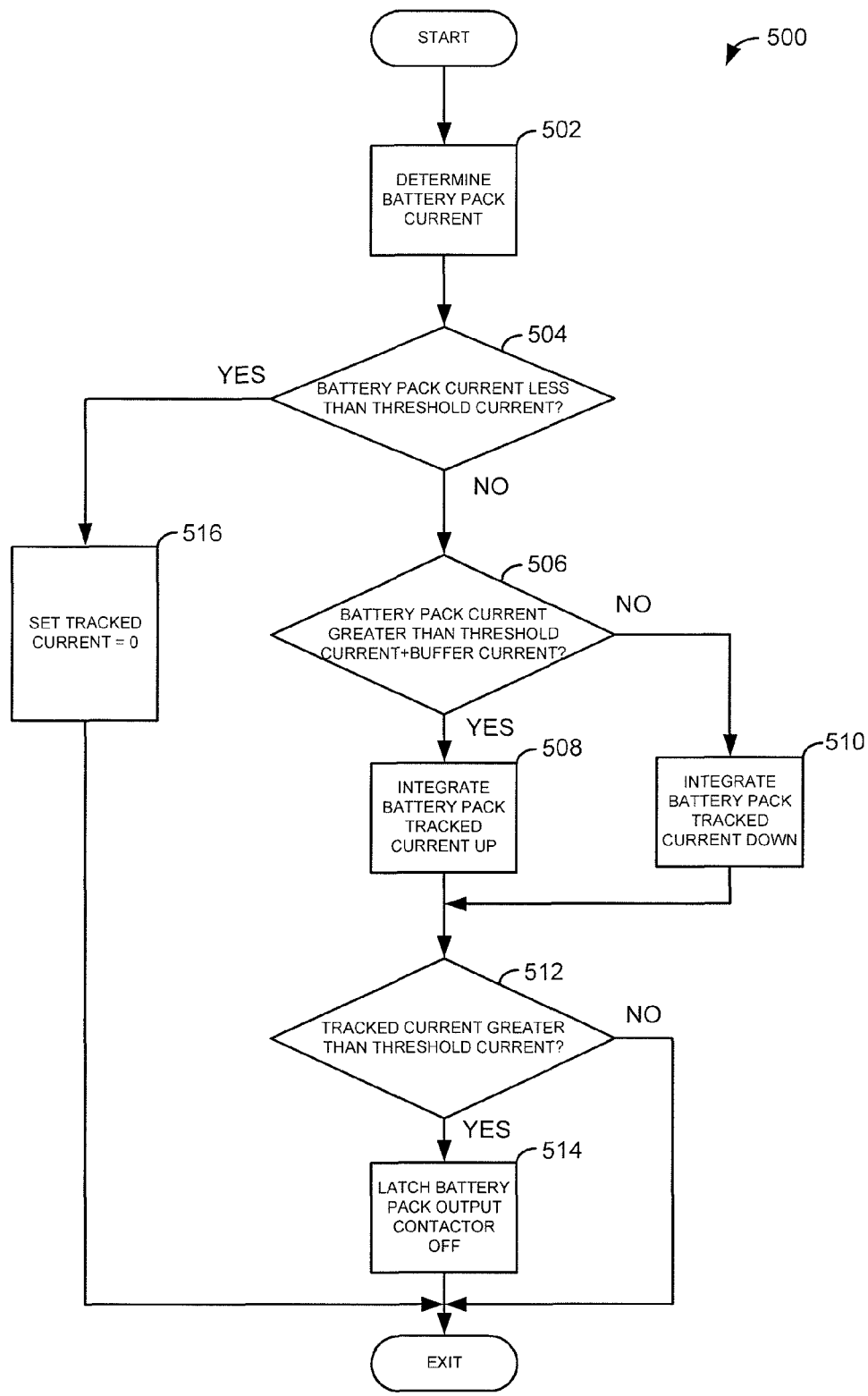
FIG. 5 shows flowchart of a method for controlling output of a battery pack.

Referring now to FIG. 5, a flowchart of a method for controlling output of a battery pack is shown. The flowchart may be executed with computer readable instructions by a microcontroller (e.g., a microcontroller of BCM 438 of FIG. 4). At 502, routine 500 determines tracked variables of a battery pack. Tracked variables may include but are not limited to battery voltage, battery current, battery storage capacity, battery power, battery cell voltage, voltage across a battery output contactor, and battery energy. Further, the tracked variables may be influenced by a source external of the battery pack (e.g., a motor or inverter). In one example, battery pack current is determined via a current shunt (e.g., 472 of FIG. 4). A voltage develops across the current shunt that is proportional to the current flowing into or from the battery pack to a load or source external the battery pack. In one example, the battery pack may source current to a load to propel a vehicle and supply power to ancillary vehicle power systems. Further, the battery pack can sink current from a vehicle motor or from a charging system. Thus, current may be positive and negative. In another example, the battery pack voltage is the tracked variable used to determine when to open a battery pack output contactor. Further, it is possible to track one or more of the above tracked variables to determine when to open a battery pack output contactor. In one example, the data from sensed the battery tracked variable is transmitted over a CAN bus or other type of communication link to a BCM. Routine 500 proceeds to 504 after determining battery pack current.

At 504, routine 500 judges whether a tracked variable of a battery pack current is less than a threshold current. The threshold value may vary depending on battery pack operating conditions. For example, a threshold current may be reduced as a temperature of the battery pack increases. In another example, a threshold current can be adjusted for battery age or loss of battery capacity. For example, when the battery pack is new, the battery sourcing threshold current is a first level. As the battery pack ages and some battery pack charge storage capacity is lost, the battery sourcing threshold current may be adjusted to a second level, the second level lower than the first level. Likewise, the battery pack threshold current may be adjusted for conditions when the battery pack is sinking current. Thus, the battery pack can have different current thresholds for sinking and sourcing current. Similar thresholds apply to tracked variables that are other than battery current.

It should be noted that at 504 routine 500 acts as a controller that takes no action other than to set one or more integrated parameters that are related to a tracked variable to a level or amount of zero when the one or more tracked variables are less than a threshold value or amount for the tracked variable. If the tracked variable exceeds a threshold level at 504 routine 500 essentially starts to integrate one or more parameters related to the one of more tracked variables.

If battery pack tracked variable is less than a threshold level, routine 500 proceeds to 516. Otherwise, routine 500 proceeds to 506.

At 506, routine 500 judges whether or not one or more battery pack tracked variables are greater than a threshold level plus a buffer amount that applies to the tracked variable (e.g., if the tracked variable is voltage the buffer voltage may be 20 volts). The buffer amount for each tracked variable may be a variable amount that is adjusted in response to operating conditions of the battery. For example, if the tracked variable is current the buffer current may be reduced as a temperature of the battery pack increases. In another example, the buffer current can be adjusted for battery age or loss of battery capacity. For example, when the battery pack is new, the battery buffer current is a first level. As the battery pack ages and some battery pack charge storage capacity is lost, the battery buffer current may be adjusted to a second level, the second level lower than the first level. Likewise, the buffer current may be adjusted for conditions when the battery pack is sinking current. Thus, the battery pack can have different buffer current thresholds for sinking and sourcing current. Likewise, buffer amounts for other tracked variables (e.g. battery voltage) may be adjusted similarly to buffer current. If it is the battery pack tracked variable is not greater than a threshold amount plus a buffer amount routine 500 proceeds to 510. Otherwise, routine 500 proceeds to 508.

At 508, routine 500 integrates up a parameter that is related to a battery pack tracked variable. By integrating up the parameter, the integrated amount of the parameter increases. As mentioned above one or more tracked variables may be tracked therefore, one or more parameters related to the tracked variables is integrated. In one example, routine 500 integrates battery pack current error squared according to the following equation:

$$i2tcur = i2tcur + dt \cdot (iact - threscur - buffcur)^2$$

Where i2tcur is an integrated value associated with a parameter related to battery current error, dt is the time between battery pack current samples, iact is the actual battery pack current from a current shunt or other device, thescur is a threshold amount of battery pack current, and buffcur is an amount of buffer current. Thus, in this example, routine 500 integrates a parameter that is related to battery current when battery current exceeds a threshold current. In this example, the tracked variable current is squared and integrated with respect to time to determine energy entering or exiting the battery pack. Further, the integrated value i2tcur increases when iact is greater than threscur plus buffcur. Consequently, current that exceeds the threshold level of current may be tracked whereas current that is less than a threshold current is not tracked. Similarly, parameters related to other battery pack tracked may be integrated. It should also be noted that the battery pack tracked variable may be raised by an exponent other than 2, 1.5 for example, before being included in an integral value related to the tracked variable. Further, the battery pack tracked parameter may be mathematically manipulated in other way before being included in an integral. For example, battery current may be multiplied by battery pack voltage to determine battery pack power before being included in an integral. In other examples, the tracked variable may be included in the integral without being mathematically manipulated. Routine 500 proceeds to 512 after integrating a parameter related to a battery pack tracked variable.

At 510, routine 500 integrates down a parameter that is related to a battery pack tracked variable. By integrating down the parameter, the integrated amount of the parameter decreases. As mentioned above one or more tracked variables may be tracked therefore, one or more parameters related to the tracked variables is integrated. In one example, routine 500 integrates battery pack current according to the following equation:

$$i2tcur = i2tcur - dt \cdot (iact - threscur - buffcur)^2$$

Where the variables are as described above. According to the equation at 510, the integrated value i2tcur decreases when iact is less than threscur plus buffcur. As a result, current that exceeds the threshold level but is less than the threshold current level plus a buffer level decreases the amount of i2tcur. In addition, the value of 12tcur may be clipped at zero if desired. Routine 500 proceeds to 512 after integrating battery pack current.

By proceeding through 508 or 510, routine 500 integrates a parameter related to a tracked battery variable. Routine 500 acts as a controller integrating a positive error when the tracked variable is greater than a threshold amount plus the buffer amount, and routine 500 acts as a controller integrating a negative error when the tracked variable is greater than the threshold amount, but less than the threshold amount plus the buffer amount.

At 512, routine 500 judges whether or not the integrated parameter related to a battery pack tracked variable exceeds a threshold amount or level. In one example, based on the parameters described above, when the level of i2tcur is greater than a threshold level routine 500 proceeds to 514. The threshold for the integrated parameter related to a battery pack tracked variable may be a variable amount of that is adjusted in response to operating conditions of the battery. For example, the threshold battery energy (e.g. integrated $iact^2$) may be reduced as a temperature of the battery pack increases. In another example, the threshold battery energy can be adjusted for battery age or loss of battery capacity. For example, the tracked current threshold can decrease as battery temperature increases. Likewise, the threshold battery energy may be adjusted for conditions when the battery pack is sinking current. Thus, the battery pack can have different battery energy thresholds for sinking and sourcing current. For example, a battery energy threshold may be at a first value when current is sourced from the battery pack, and a battery energy threshold may be at a second value when the battery pack is sinking current. If the integrated parameter related to a tracked battery variable is greater than the threshold amount or value routine 500 proceeds to 514. Otherwise, routine 500 proceeds to exit.

It may be noted that the routine of FIG. 5 operates in some aspects as a programmable fuse. However, it should also be noted that battery pack current may be processed in alternative ways without departing from the scope or breadth of this description. For example, in some applications, the current may be simply compared to a threshold current. If the threshold current is exceeded, the battery pack contactor decouples the battery pack from the battery load. Further, different contactor control modes may be used during different operating conditions. For example, during a first mode, the contactors may be controlled according to the integrated parameter related to a tracked battery variable as noted above, whereas under other modes the contactors may be controlled (e.g., opened), when current is above a threshold limit, irrespective of the integral of the current. For example, different contactor controls (e.g., different of the above modes) may be used during charging and discharging operation.

At 514, routine 500 commands a battery pack contactor to an open state so that the battery pack is electrically decoupled from loads and sources external to the battery pack. In one example, the contactor is responds as an electrically actuated switch and physically decouples the battery pack from the vehicle electrical system. In addition, routine 500 provides a status signal to a vehicle controller so that the vehicle controller may be made aware of the battery state. In some examples, routine 500 also provides an indication of battery contactor opening to a vehicle driver. Routine 500 exits after the battery pack contactor is commanded to an open state.

It should be mentioned that for some systems and methods a predetermined sequence may be utilized before the contactor may be closed after being opened by the method of FIG. 5. For example, the vehicle controller may have to successfully complete a self test diagnostic before the battery output contactor is closed. Further, in some examples, the vehicle controller is required to send conformation of successful completion of a diagnostic to the battery controller via CAN before the contactor is closed. Further still, in some examples the battery output contactor may not be permitted to close until a vehicle technician clears a code of a vehicle controller.

Thus, the method of FIG. 5 provides for a method for controlling output of a battery pack, comprising: opening a contactor that electrically couples said battery pack to an electrical circuit external of said battery pack when an integrated amount of a current of said battery pack exceeds a threshold level, said current integrated when said current is greater than a threshold amount of current. As illustrated by the above equations, the integrated amount of said current may be related to an amount of current supplied by said battery pack to a load external of said battery pack. Further, the integrated amount of said current may be related to an amount of current received by said battery pack by a source external of said battery pack, with the current being monitored by a current shunt circuit. The integrated amount of current may include multiplying the current by time, the current being an amount of current that is greater than a threshold current, a value of the current being transmitted over a CAN link. The threshold current may also be varied with conditions, such as charging versus discharging of the battery pack. Further, the integral may be based on the absolute value of current.

Further, the method of FIG. 5 also illustrates one example of a method for controlling output of a battery pack, comprising: sensing a current of a battery pack with an ADC; opening a contactor that electrically couples said battery pack to an electrical circuit external of said battery pack when an integrated amount of said current of said battery pack exceeds a threshold level, said current integrated when said current is greater than a threshold amount of current; and notifying a vehicle controller of a state of said contactor. The ADC may be included in a module with said contactor as noted in FIG. 4. Data from the ADC may be supplied to the battery control module via a CAN link, wherein said integration of said current is clipped to a value of zero during a first condition. The contactor may be opened when the vehicle controller is not following current limits sent to said vehicle controller from a battery pack controller.

Thus, the method of FIG. 5 also provides for a method for controlling output of a battery pack, comprising: opening a contactor that electrically couples said battery pack to an electrical circuit external of said battery pack when an integrated variable or parameter related to a tracked variable of the battery pack exceeds a threshold amount, the integrated variable or parameter integrated when the tracked variable of said battery pack is greater than a threshold amount. The method includes where the integrated variable or parameter is related to an amount of current supplied by said battery pack to a load external of said battery pack. The method also includes where the integrated variable or parameter is related to a battery cell voltage of said battery pack as influenced by a source external of said battery pack. The method further includes where the integrated variable or parameter is related to a voltage of said battery pack as influenced by a source external of said battery pack. The method also includes where the integrated variable or parameter is related to a voltage across a contactor of said battery pack influenced by a source external of the battery pack. The method also includes where the integrated variable related to a tracked variable of the battery pack increases when the tracked variable of the battery pack is greater than the threshold level plus a buffer level. In one example, the method includes a value of the tracked variable of the battery pack is battery current and is transmitted over a CAN link.

In this way, it is possible to enable greater flexibility to the vehicle controller in staying within current limits, taking account of the interplay between the degree and duration of over-current operation.

The subject matter of the present disclosure includes all novel and nonobvious combinations and subcombinations of the various systems and configurations, and other features, functions, and/or properties disclosed herein.

As will be appreciated by one of ordinary skill in the art, routines described in FIG. 5 may be represented by instructions for a controller and may be represented by one or more of any number of processing strategies such as event-driven, interrupt-driven, multi-tasking, multi-threading, and the like. As such, various steps or functions illustrated may be performed in the sequence illustrated, in parallel, or in some cases omitted. Likewise, the order of processing is not necessarily required to achieve the objects, features, and advantages described herein, but is provided for ease of illustration and description. Although not explicitly illustrated, one of ordinary skill in the art will recognize that one or more of the illustrated steps or functions may be repeatedly performed depending on the particular strategy being used.

The following claims particularly point out certain combinations and subcombinations regarded as novel and nonobvious. These claims may refer to "an" element or "a first" element or the equivalent thereof. Such claims should be understood to include incorporation of one or more such elements, neither requiring nor excluding two or more such elements. Other combinations and subcombinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A method for controlling output of a battery pack, comprising:
    opening a contactor that electrically couples said battery pack to an electrical circuit external of said battery pack when an integration of a degree and duration of a value of a variable or parameter related to a tracked variable of the battery pack exceeds a threshold amount, the variable or parameter integrated up when the tracked variable of said battery pack is greater than a threshold amount, and wherein the variable or parameter is related to a battery cell voltage of said battery pack is influenced by a source external of said battery pack, and wherein said value of said variable is integrated down when said tracked variable of said battery pack is not greater than said threshold amount.

2. The method of claim 1, wherein the variable or parameter is related to an amount of current supplied by said battery pack to a load external of said battery pack, where said threshold amount is adjusted in response to battery operating conditions, and where said degree and duration of said value of said variable or parameter is integrated with respect to time.

3. The method of claim 1, wherein the variable or parameter is related to a voltage of said battery pack as influenced by a source external of said battery pack.

4. The method of claim 1, wherein the variable or parameter is related to a voltage across the contactor of said battery pack influenced by a source external of the battery pack.

5. The method of claim 1, wherein the variable related to a tracked variable of the battery pack increases when the tracked variable of the battery pack is greater than the threshold level plus a buffer level.

6. The method of claim 1, wherein a value of the tracked variable of the battery pack is battery current and is transmitted over a CAN link, and where said variable or parameter is a battery pack current error squared.

7. A system for controlling output of a battery pack, comprising:
a plurality of battery cells;
a current sensor in electrical communication with said plurality of battery cells;
a contactor in electrical communication with said plurality of battery cells and a load external said battery pack; and
a controller, said controller in communication with said current sensor and said contactor, said controller including instructions for opening said contactor when an integration of a degree and duration of a value of a variable or parameter related to a tracked variable of said battery pack exceeds a threshold amount, and wherein said tracked variable is a current from said current sensor, where integration of said degree and duration of said value of said variable or parameter increases said value of said variable or parameter when said tracked variable of said battery pack exceeds said threshold, and where integration of said degree and duration of said value of said variable or parameter decreases said value of said variable or parameter when said tracked variable of said battery pack does not exceed said threshold, and further comprising a plurality of battery modules comprised of said plurality of battery cells.

8. The system of claim 7, further comprising a CAN link within said battery pack, said CAN link providing current data from said current sensor to said controller, and additional instructions to adjust said threshold amount in response to battery pack operating conditions.

9. The system of claim 7, further comprising a CAN link between said controller and a vehicle controller, where said variable or parameter is a battery pack current error squared, and where said degree and duration of said value of said variable or parameter is integrated with respect to time.

10. The system of claim 7, wherein said controller includes further instructions for integrating data from said current sensor when a current of said battery pack is greater than a threshold current.

11. The system of claim 7, wherein said controller includes further instructions for closing said contactor after executing a predetermined sequence.

12. The system of claim 7, wherein said current sensor is a shunt device, and wherein said controller is a battery pack controller.

* * * * *